US009565761B2

(12) United States Patent
Nakagawa

(10) Patent No.: US 9,565,761 B2
(45) Date of Patent: Feb. 7, 2017

(54) WIRING BOARD

(71) Applicant: KYOCERA Circuit Solutions, Inc., Kyoto (JP)

(72) Inventor: Yoshihiro Nakagawa, Osaka (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 31 days.

(21) Appl. No.: 14/809,345

(22) Filed: Jul. 27, 2015

(65) Prior Publication Data
US 2016/0037644 A1    Feb. 4, 2016

(30) Foreign Application Priority Data
Jul. 31, 2014  (JP) ................................. 2014-155640

(51) Int. Cl.
| H05K 7/10 | (2006.01) |
| H05K 1/11 | (2006.01) |
| H05K 1/18 | (2006.01) |
| H05K 7/00 | (2006.01) |
| H05K 1/02 | (2006.01) |

(52) U.S. Cl.
CPC ............. H05K 1/111 (2013.01); *H05K 1/0296* (2013.01); *H05K 1/112* (2013.01); *H05K 1/117* (2013.01); *H05K 7/10* (2013.01); *H05K 2201/09227* (2013.01); *H05K 2201/10674* (2013.01)

(58) Field of Classification Search
CPC ......... H05K 1/111; H05K 1/112; H05K 1/117; H05K 7/10
USPC .. 361/764, 767, 783, 808; 333/238; 257/697
See application file for complete search history.

(56) References Cited

U.S. PATENT DOCUMENTS

| 7,847,404 | B1 * | 12/2010 | Schwegler | ........ H01L 23/49827 257/532 |
| 2003/0183419 | A1 * | 10/2003 | Miller | ............... H01L 23/49838 174/261 |
| 2011/0199165 | A1 * | 8/2011 | Yeh | ........................ H05K 1/025 333/1 |

FOREIGN PATENT DOCUMENTS

JP    2000-031329 A    1/2000

* cited by examiner

*Primary Examiner* — Binh Tran
(74) *Attorney, Agent, or Firm* — Volpe and Koenig, P.C.

(57) ABSTRACT

In the wiring board of the present invention, the land pattern for power supply, connected to the semiconductor element connection pad for power supply through a via conductor and arranged below the segment region, includes a strip-shaped continued portion in the position corresponding to the outer peripheral portion except the outer peripheral side of the mounting portion in the segment region, and the strip-shaped continued portion and the power supply plane arranged therebelow are connected through a via conductor.

2 Claims, 5 Drawing Sheets

WIRING BOARD

BACKGROUND OF THE INVENTION

1. Technical Field

The present invention relates to a wiring board for mounting a semiconductor element.

2. Background

Conventionally, the wiring board for mounting a semiconductor element has a multi-layer structure where a plurality of insulating layers and conductor layers are alternately laminated (for example, Japanese Unexamined Patent Publication No. 2000-31329). On a central portion of the upper surface of the wiring board, a mounting portion for mounting a semiconductor element is formed. On the upper surface and the lower surface of the multi-layer structure, a part of the conductor layer is exposed, and furthermore, a solder resist layer is deposited thereon. In the mounting portion, a plurality of semiconductor element connection pads to be flip-chip connected to electrodes of the semiconductor element are arranged in a lattice shape. The substantially entire surface of the lower surface of the wiring board is an external connection surface for connecting with the outside. A plurality of external connection pads for connecting with an external electric circuit board are arranged in a lattice shape on the lower surface. The semiconductor element connection pad includes those for signal, for grounding, and for power supply. Likewise, the external connection pad also includes those for signal, for grounding, and for power supply. Each of the semiconductor element connection pads is electrically connected to the corresponding one of the external connection pads through the internal conductor layer.

The semiconductor element connection pads for power supply and for grounding are mainly arranged in the central portion of the mounting portion. The semiconductor element connection pads for signal, for grounding, and for power supply are arranged in a mixed manner in the outer peripheral portion of the mounting portion. The semiconductor element connection pads for signal, for grounding, and for power supply arranged in the outer peripheral portion of the mounting portion form a small group of pad group where the respective sets of a plurality of pads are arranged in a predetermined positional relation. Here, the individual region where this pad group is formed is referred to as a "segment region".

In FIG. 2, a top view of a general wiring board is shown. A segment region B occupies a part of the outer peripheral portion of a mounting portion A of the wiring board. A plurality of such the segment regions B are present in the outer peripheral portion of the mounting portion A. An example of arrangement of the semiconductor element connection pads for signal S, for grounding G, and for power supply P in the segment region B is shown. It should be noted that "S" represents the semiconductor element connection pad for signal, "G" represents the semiconductor element connection pad for grounding, and "P" represents the semiconductor element connection pad for power supply. In FIG. 2, the semiconductor element connection pads S, G and P in the segment region B include five columns L1 to L5 along the outer periphery side of the mounting portion A. The semiconductor element connection pads for grounding G are arranged on the outermost column L1 and the innermost column L5 in the segment region B. The semiconductor element connection pads for power supply P are arranged on the column L3 in the center. On the column L2 between the L1 and the L3, and on the column L4 between the L3 and the L5, the semiconductor element connection pads for signal S are arranged in the central portion, and the semiconductor element connection pads for grounding G and for power supply P are arranged at both ends thereof.

A part of the conductor layer at an uppermost layer are exposed from the circular openings provided in the solder resist layer, whereby these semiconductor element connection pads S, G, and P are formed. In FIGS. 3A to 3D, a conductor layer 11 at the uppermost layer and conductor layers 12 to 14 formed below the conductor layer 11 in the vicinity of the segment region B of the conventional wiring board are shown. In FIG. 3A, the openings of the solder resist layer at the uppermost layer are indicated by dashed circles. In FIGS. 3B to 3D, positions of the via conductors connected to the conductor layer at the upper layer are indicated by dashed circles, and the sign G, the sign P and the sign S in these circles represent the via conductors for grounding, for power supply, and for signal, respectively.

As shown in FIG. 3A, the conductor layer 11 at the uppermost layer includes patterns 11a to 11d shown in the following (a) to (d):

(a) the signal pattern 11a forming a semiconductor element connection pad for signal S individually;

(b) the grounding plane 11b connecting the semiconductor element connection pads for grounding G on the column L1 and the column L2 to one, and extending to the outside of the mounting portion A;

(c) the grounding pattern 11c connecting the semiconductor element connection pads for grounding G on the column L5 and the column L4 to one; and (d) the power supply pattern 11d connecting the semiconductor element connection pads for power supply P on the column L3 and the column L4 to one.

As shown in FIG. 3B, the conductor layer 12 formed below the conductor layer 11 includes patterns 12a to 12d shown in the following (a) to (d):

(a) the strip-shaped signal wiring pattern 12a extending from the bottom of the semiconductor element connection pad for signal S to the outside of the mounting portion A;

(b) the grounding plane 12b adjacent to the signal wiring pattern 12a, extending to the outside of the mounting portion A;

(c) the grounding pattern 12c formed in the same position as the grounding pattern 11c at the upper layer; and (d) the land pattern for power supply 12d arranged so as to be separated by the signal wiring pattern 12a below a part of the semiconductor element connection pads for power supply P.

Each of the signal wiring patterns 12a is connected to the corresponding one of the signal patterns 11a at the upper layer through one via conductor. The grounding plane 12b and the grounding pattern 12c are respectively connected to the grounding plane 11b and the grounding pattern 11c at the upper layer through a plurality of via conductors. The land pattern for power supply 12d is connected to the power supply pattern 11d at the upper layer through a plurality of via conductors.

As shown in FIG. 3C, the conductor layer 13 formed below the conductor layer 12 includes a solidly spread grounding plane 13a and a land pattern for power supply 13b. The grounding plane 13a is connected to the grounding plane 12b and the grounding pattern 12c at the upper layer through a plurality of via conductors. The land pattern for power supply 13b is connected to the land pattern 12d at the upper layer through a plurality of via conductors.

As shown in FIG. 3D, the conductor layer 14 formed below the conductor layer 13 includes a power supply plane 14a and a land pattern for grounding 14b. The power supply plane 14a is connected to the land pattern 13b at the upper layer through a plurality of via conductors. Thereby, the semiconductor element connection pads for power supply P and the power supply plane 14a are electrically connected to each other through the land patterns for power supply 12d and 13b.

However, in such a conventional wiring board, the land pattern for power supply 12d of the conductor layer 12 connected to the power supply pattern 11d forming the semiconductor element connection pads for power supply P in the segment region B through the via conductors is divided by the signal wiring pattern 12a, and the area becomes smaller. Therefore, the inductance of the current path between the semiconductor element connection pads for power supply P and the power supply plane 14a connected to each other through the via conductors with the land patterns for power supply 12d and 13b interposed therebetween is increased. As a result, there has been a problem that the sufficient power is not supplied in each segment region B, and that it is difficult to sufficiently exert the capability of the semiconductor element to be mounted.

SUMMARY

The present invention provides a wiring board capable of exerting sufficiently the capability of a semiconductor element to be mounted by lowering the inductance of a power supply path in the segment region.

A wiring board according to an embodiment of the present invention includes:

a mounting portion including an upper surface on which a semiconductor element is to be mounted;

a segment region arranged in an outer peripheral portion of the mounting portion, the segment region including a semiconductor element connection pad for power supply, a semiconductor element connection pad for grounding, and a semiconductor element connection pad for signal forming a plurality of columns lined up along an outer periphery side of the mounting portion and being intermixed;

among a plurality of the columns, an innermost side column and an outermost side column being formed by the semiconductor element connection pad for grounding, and at least one column positioned between the innermost side column and the outermost side column being formed by the semiconductor element connection pad for power supply;

a first lower layer conductor layer arranged below the segment region;

the first lower layer conductor layer including:

a land pattern for power supply being connected to the semiconductor element connection pad for power supply through a via conductor;

a signal wiring pattern being connected to the semiconductor element connection pad for signal through a via conductor, the signal wiring pattern extending to an outside of the mounting portion; and a grounding plane to which the semiconductor element connection pad for grounding being connected through a via conductor, the grounding plane extending to an outside of the mounting portion;

a second lower layer conductor layer arranged below the first lower layer conductor layer; and the second lower layer conductor layer including a power supply plane connected to the land pattern for power supply through a via conductor, wherein the land pattern for power supply includes a strip-shaped continued portion in a position corresponding to an outer peripheral portion except an outer periphery side of the mounting portion in each of the segment regions, and wherein the strip-shaped continued portion and the power supply plane are connected through a via conductor.

According to the wiring board according to the embodiment, the land pattern for power supply, connected to the semiconductor element connection pads for power supply through the via conductors and arranged below the segment region, includes a strip-shaped continued portion in the position corresponding to the outer peripheral portion except the outer periphery side of the mounting portion in the segment region. Therefore, it is possible to connect between the strip-shaped continued portion and the power supply plane arranged therebelow by closely spaced via conductors. Thereby, the inductance of the power supply path between the semiconductor element connection pads for power supply and the power supply plane can be lowered. Therefore, it is possible to supply sufficient power from the segment region to the semiconductor element to be mounted. As a result, it is possible to sufficiently exert the capability of the semiconductor element to be mounted.

DETAILED DESCRIPTION

Figure 1A:
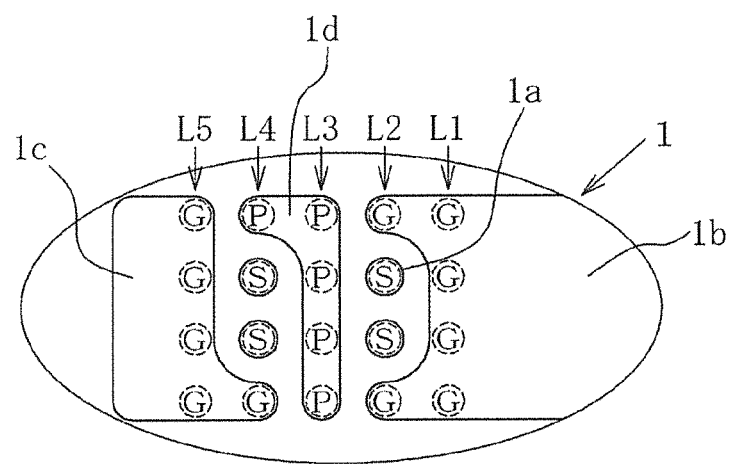
FIGS. 1A to 1D are main part plan views of each of the conductor layers for illustrating the wiring board according to an embodiment of the present invention.

Next, a wiring board according to one embodiment of the present invention will be described. The wiring board according to the one embodiment has a multi-layer structure where insulating layers and conductor layers are alternately laminated in the same manner as a conventional wiring board. A solder resist layer is deposited on an upper surface and a lower surface of the wiring board so that a part of the conductor layer is exposed. The insulating layer includes a resin-type insulating material. Examples of the resin-type insulating material include the resin-type insulating material with the glass cloth where the glass cloth is impregnated with a thermosetting resin such as an epoxy resin, the resin-type insulating material without the glass cloth where an inorganic insulating filler such as silicon oxide powder is dispersed in a thermosetting resin such as the epoxy resin, and the like. The conductor layer includes a copper foil and a copper plating. A solder resist layer includes the resin-type insulating material without the glass cloth where the inorganic insulating filler is dispersed in a thermosetting resin such as an epoxy resin.

On a central portion of the upper surface of the wiring board, a mounting portion for mounting a semiconductor element is formed. In the mounting portion, a plurality of semiconductor element connection pads to be flip-chip connected to the electrodes of the semiconductor element are arranged in a lattice shape. The semiconductor element connection pad is formed by partially exposing part of the conductor layer at an uppermost layer from the solder resist layer. The substantially entire surface of the lower surface of the wiring board is an external connection surface for connecting with the outside. A plurality of external connection pads for connecting with an external electric circuit board are arranged in a lattice shape on the lower surface. The external connection pad is formed by partially exposing part of the conductor layer at a lowermost layer from the solder resist layer. The semiconductor element connection pad includes those for signal, for grounding, and for power supply. Likewise, the external connection pad also includes those for signal, for grounding, and for power supply. Each of the semiconductor element connection pads is electrically connected to the corresponding one of the external connection pads through the internal conductor layer. The upper and lower conductor layers are connected by via conductors.

The semiconductor element connection pads for power supply and for grounding are mainly arranged in the central portion of the mounting portion. The semiconductor element connection pads for signal, for grounding, and for power supply are arranged in a mixed manner in the outer peripheral portion of the mounting portion. The semiconductor element connection pads for signal, for grounding, and for power supply arranged in the outer peripheral portion of the mounting portion form a small group of pad group where the respective sets of a plurality of pads are arranged in a predetermined positional relation. Here, the individual region where this pad group is formed is referred to as a "segment region".

Figure 2:
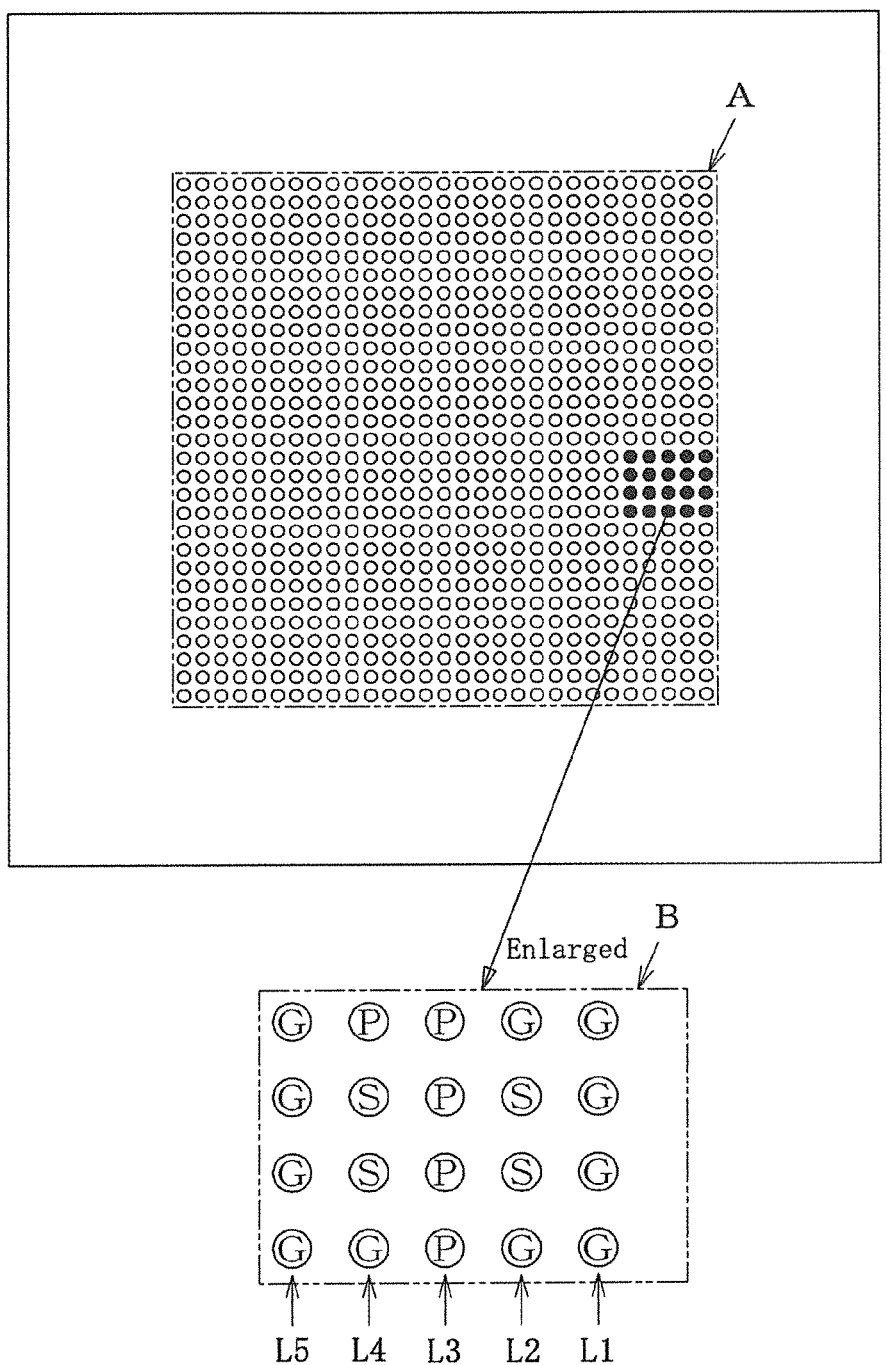
FIG. 2 is a main part plan view showing an example of the arrangement of the semiconductor element connection pads in the segment region of the general wiring board.
Figure 3A:
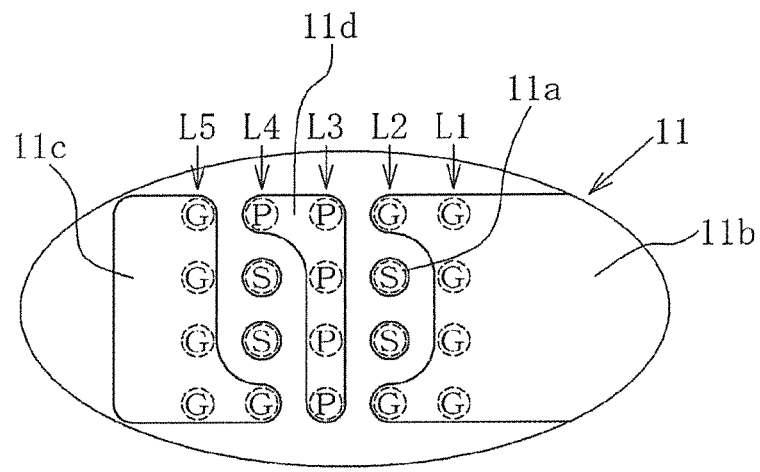
FIGS. 3A to 3D are main part plan views of each of the conductor layers for illustrating the conventional wiring board.
Figure 3B:
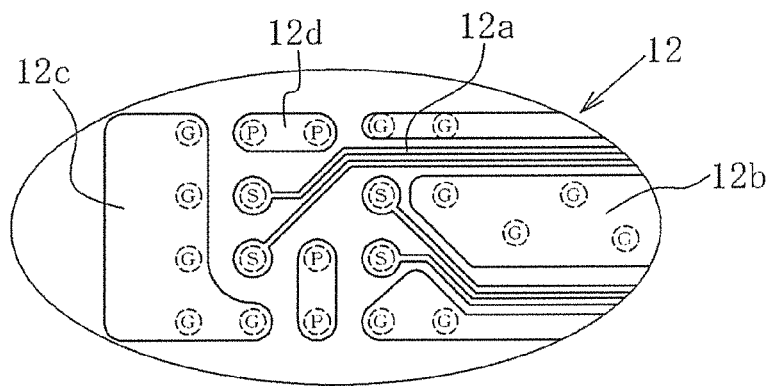
Figure 3C:
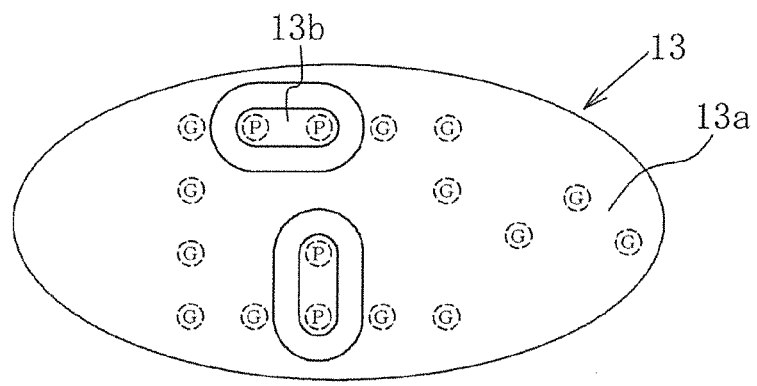
Figure 3D:
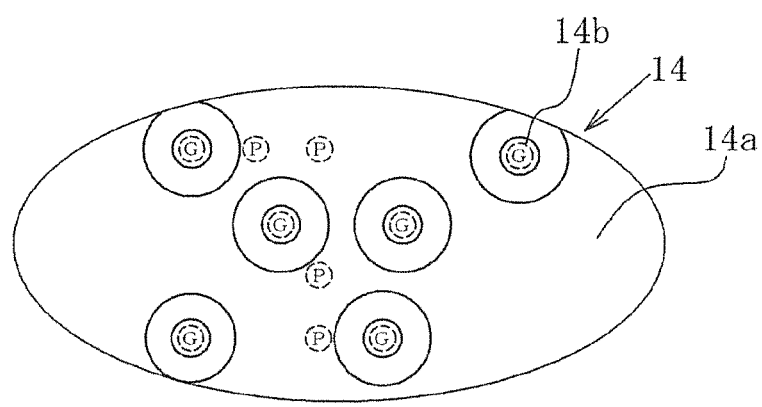

As shown in FIG. 2, the semiconductor element connection pads in the segment region B of the wiring board according to the embodiment are arranged in the same manner as in a general wiring board. Specifically, the semiconductor element connection pads S, G and P in the segment region B include five columns L1 to L5 along the outer periphery side of the mounting portion A. The semiconductor element connection pads for grounding G are arranged on the outermost column L1 and the innermost column L5 in the segment region B. The semiconductor element connection pads for power supply P are arranged on the column L3 in the center. On the column L2 between the L1 and the L3, and on the column L4 between the L3 and the L5, the semiconductor element connection pads for signal S are arranged in the central portion, and the semiconductor element connection pads for grounding G and for the power supply P are arranged at both ends thereof.

Figure 1B:
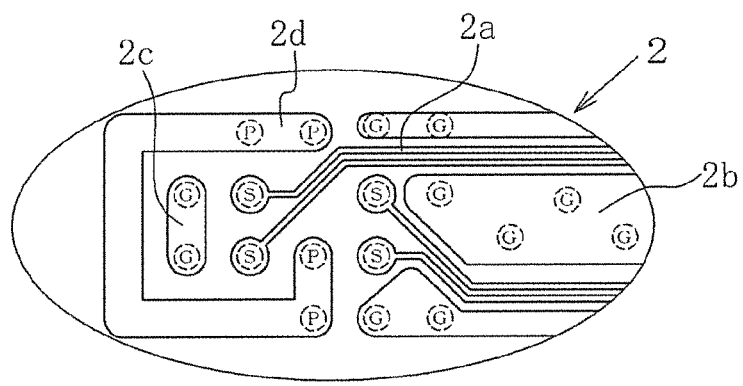
Figure 1C:
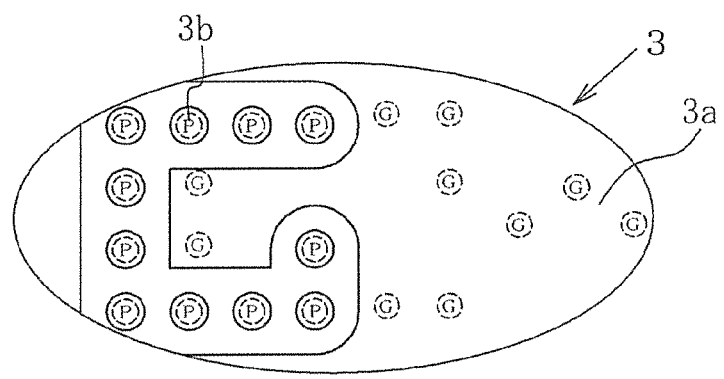
Figure 1D:
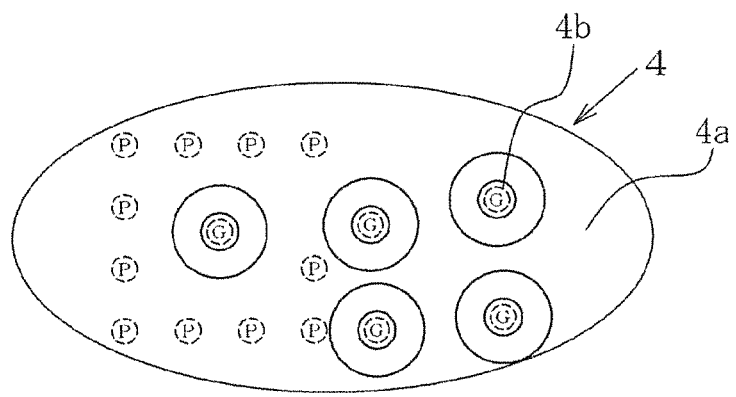

A part of the conductor layer at the uppermost layer are exposed from the circular openings provided in the solder resist layer, whereby these semiconductor element connection pads S, G, and P are formed. Here, a conductor layer 1 at the uppermost layer and conductor layers 2 to 4 formed below the conductor layer 1 in the segment region B of the wiring board according to the one embodiment are shown in FIGS. 1A to 1D. In FIG. 1A, the openings of the solder resist layer at the uppermost layer are indicated by dashed circles. In FIGS. 1B to 1D, positions of the via conductors connected to the conductor layer at the upper layer are indicated by dashed circle, and the sign G, the sign P and the sign S in these circles represent the via conductors for grounding, for power supply, and for signal, respectively.

As shown in FIG. 1A, the conductor layer 1 at the uppermost layer includes patterns 1a to 1d shown in the following (1) to (4):

(1) the signal pattern 1a forming a semiconductor element connection pad for signal S individually;

(2) the grounding plane 1b connecting the semiconductor element connection pads for grounding G on the column L1 and the column L2 to one, and extending to the outside of the mounting portion A;

(3) the grounding pattern 1c connecting the semiconductor element connection pads for grounding G on the column L5 and the column L4 to one; and (4) the power supply pattern 1d connecting the semiconductor element connection pads for power supply P on the column L3 and the column L4 to one.

As shown in FIG. 1B, the conductor layer 2 (the first lower layer conductor layer) formed below the conductor layer 1 includes patterns 2a to 2d shown in the following (1) to (4):

(1) the strip-shaped signal wiring pattern 2a extending from the bottom of the semiconductor element connection pad for signal S to the outside of the mounting portion A;

(2) the grounding plane 2b adjacent to the signal wiring pattern 2a, extending to the outside of the mounting portion A;

(3) the land pattern for grounding 2c positioned below a part of the semiconductor element connection pads G for grounding on the column L5; and (4) the land pattern for power supply 2d arranged in a continued strip shape from the bottom of a part of the semiconductor element connection pads for power supply P to the position corresponding to the outer peripheral portion except the outer periphery side of the mounting portion A in the segment region B so as to bypass the signal wiring pattern 2a.

Each of the signal wiring patterns 2a is connected to the corresponding one of the signal patterns 1a at the upper layer through one via conductor. The grounding plane 2b and the land pattern for grounding 2c are respectively connected to the grounding plane 1b and the grounding pattern 1c at the upper layer through a plurality of via conductors. The land pattern for power supply 2d is connected to the power supply pattern 1d at the upper layer through a plurality of via conductors.

As shown in FIG. 1C, the conductor layer 3 (the third lower layer conductor layer) formed below the conductor layer 2 includes a solidly spread grounding plane 3a and a plurality of land patterns for power supply 3b. The land patterns for power supply 3b are arranged closely side by side directly below the land pattern for power supply 2d at the upper layer. The grounding plane 3a is connected to the grounding plane 2b and the land pattern for grounding 2c at the upper layer through a plurality of via conductors. Each of the land patterns for power supply 3b is connected to the land pattern 2d at the upper layer through one via conductor.

As shown in FIG. 1D, the conductor layer 4 (the second lower layer conductor layer) formed below the conductor layer 3 includes a power supply plane 4a and a land pattern for grounding 4b. The power supply plane 4a is connected to the land patterns for power supply 3b at the upper layer through a plurality of via conductors.

According to the wiring board according to the one embodiment, the land pattern for power supply 2d connected to the semiconductor element connection pads for power supply P through the via conductors and arranged below the segment region B includes a strip-shaped continued portion in the position corresponding to the outer peripheral portion except the outer periphery side of the mounting portion A in the segment region B. Therefore, the strip-shaped continued portion and the power supply plane 4a arranged therebelow are connected through a plurality of closely spaced via conductors connecting therebetween vertically to the conductor layer 4. Thereby, the inductance of the power supply path between the semiconductor element connection pads for power supply P and the power supply plane 4a can be lowered. Therefore, it is possible to supply sufficient power from the segment region B to the semiconductor element to be mounted. As a result, it is possible to sufficiently exert the capability of the semiconductor element to be mounted.

The present invention is not limited to the one embodiment described above, and various modifications are possible as long as they are within the scope of the claims. For example, in FIGS. 1A to 1D, each of the semiconductor element connection pads has a circular shape. However, the shape of each of the semiconductor element connection pads is not limited to a circular shape, and may be an elliptical shape, a polygonal shape (a triangular shape, a quadrangular shape, a pentagonal shape, a hexagonal shape, etc.), and the like.

What is claimed is:

1. A wiring board comprising:
   a mounting portion including an upper surface on which a semiconductor element is to be mounted;
   a segment region arranged in an outer peripheral portion of the mounting portion, the segment region including a semiconductor element connection pad for power supply, a semiconductor element connection pad for grounding, and a semiconductor element connection pad for signal forming a plurality of columns lined up along an outer periphery side of the mounting portion and being intermixed;
   among a plurality of the columns, an innermost side column and an outermost side column being formed by the semiconductor element connection pad for grounding, and at least one column positioned between the innermost side column and the outermost side column being formed by the semiconductor element connection pad for power supply;
   a first lower layer conductor layer arranged below the segment region;
   the first lower layer conductor layer including:
   a land pattern for power supply being connected to the semiconductor element connection pad for power supply through a via conductor;
   a signal wiring pattern being connected to the semiconductor element connection pad for signal through a via conductor, the signal wiring pattern extending to an outside of the mounting portion; and
   a grounding plane to which the semiconductor element connection pad for grounding being connected through a via conductor, the grounding plane extending to an outside of the mounting portion;
   a second lower layer conductor layer arranged below the first lower layer conductor layer; and
   the second lower layer conductor layer including a power supply plane connected to the land pattern for power supply through a via conductor,
   wherein the land pattern for power supply includes a strip-shaped continued portion in a position corresponding to an outer peripheral portion except an outer periphery side of the mounting portion in each of the segment regions, and
   wherein the strip-shaped continued portion and the power supply plane are connected through a via conductor.

2. The wiring board according to claim 1,
   further comprising a third lower layer conductor layer between the first lower layer conductor layer and the second lower layer conductor layer,
   wherein the third lower layer conductor layer includes another land pattern for power supply connected to the land pattern for power supply formed on the first lower layer conductor layer through a via conductor, and
   wherein the power supply plane formed on the second lower layer conductor layer is connected to the other land pattern for power supply through a via conductor.

* * * * *